United States Patent [19]
Webster et al.

[11] Patent Number: 5,488,317
[45] Date of Patent: Jan. 30, 1996

[54] WIRED LOGIC FUNCTIONS ON FPGA'S

[75] Inventors: William S. Webster, Dallas; David D. Wilmoth, Plano, both of Tex.

[73] Assignee: Texas Instruments Incorporated, Dallas, Tex.

[21] Appl. No.: 141,339

[22] Filed: Oct. 22, 1993

[51] Int. Cl.[6] .................... H03K 19/088; H03K 19/094
[52] U.S. Cl. .................... 326/45; 326/114; 326/83
[58] Field of Search .................... 307/465, 469; 326/29, 30, 27, 45, 49, 83, 114

[56] References Cited

U.S. PATENT DOCUMENTS

| | | | |
|---|---|---|---|
| 4,481,432 | 11/1984 | Davies, Jr. | 307/469 |
| 5,153,455 | 10/1992 | Walters, Jr. | 307/465 |
| 5,311,080 | 5/1994 | Britton et al. | 307/465 |
| 5,313,119 | 5/1994 | Cooke et al. | 307/465 |
| 5,338,982 | 8/1994 | Kawana | 307/465 |

*Primary Examiner*—Edward P. Westin
*Assistant Examiner*—Richard Roseen
*Attorney, Agent, or Firm*—Jacqueline J. Garner; Richard L. Donaldson; William E. Hiller

[57] ABSTRACT

An FPGA having a plurality of logic modules with configurable output drivers (8) to enable outputs (y) of several logic modules to be wired together. The output driver (8) comprises a n-channel and a p-channel driver transistor (16, 20) which are connected to a signal (I/O) when no wired outputs (y) are desired. If two or more outputs (y) are to be connected to enable a wired logic function, p-channel transistor (16) is disabled. Then, a weak pull-up transistor (18) may be provided. Alternatively, a senseamp may be provided to the connected outputs (y).

14 Claims, 3 Drawing Sheets

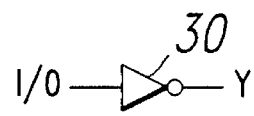
Fig. 3a
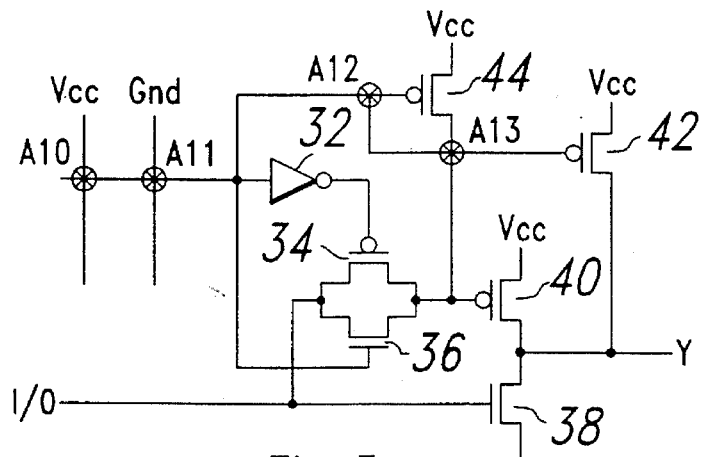
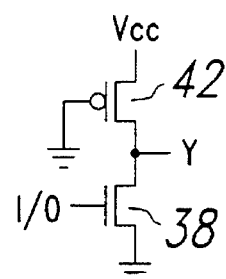
Fig. 3b
Fig. 3
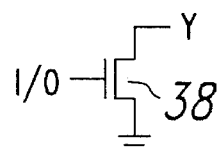
Fig. 3c
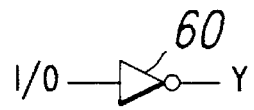
Fig. 4a
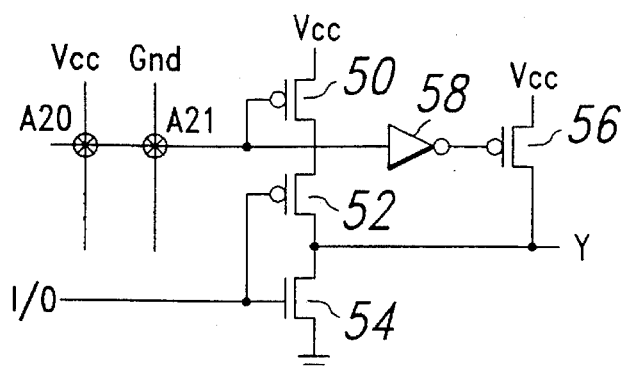
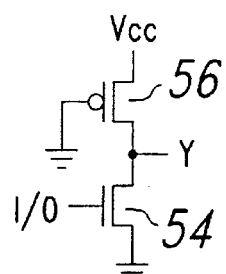
Fig. 4b
Fig. 4
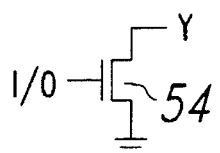
Fig. 4c

WIRED LOGIC FUNCTIONS ON FPGA'S

FIELD OF THE INVENTION

This invention relates generally to field progammable gate arrays and more specifically to wired functions on field programmable gate arrays.

BACKGROUND

Field Programmable Gate Arrays (FPGA's) consist of configurable logic modules in rows and columns separated by channels for wiring. These devices are similar to gate arrays except that they contain segmented metal tracts that may be used for interconnection. The inputs of the logic modules of FPGAs are connected to dedicated vertical metal segments. Antifuses, or similar elements, are located at the intersection of the horizontal and vertical wire segments, and between adjacent horizontal and vertical wire segments. Am antifuse is programmed by applying a voltage across its terminal. A programmed antifuse provides a low resistance bidirectional connection between two segments. By choosing lengths of horizontal and vertical wire segments and the number of tracts in each channel, routing flexibility comparable to gate arrays can be achieved.

Wide input gate functions require a large number of logic modules to implement the desired function in prior art FPGAs. This is due to the fact that each logic module has a limited number of inputs. Multiple levels of logic modules are required in order to implement a function having more inputs than a single logic module because the outputs of several logic modules will need to be combined. Utilizing multiple levels introduces additional logic delays as well as requiring additional logic modules. Accordingly, a FPGA that can implement wide input gate functions more efficiently is desired.

SUMMARY OF THE INVENTION

A field programmable gate array (FPGA) having a plurality of logic modules with configurable output drivers is disclosed. The output drivers may be configured in several ways depending on whether outputs of the logic modules are to be wired together or not. Wired logic functions provide a more efficient means for handling wide input functions. If wired outputs are not desired, the output driver may operate as a traditional output driver/inverter. If wired outputs are desired, the p-channel transistor of the driver/inverter may be disabled for each logic module output to be combined. A pull-up transistor may be added for each logic module to be combined. Alternatively, a senseamp may be provided for each interconnect line containing wired outputs.

An advantage of the invention is providing a FPGA that can more efficiently handle wide-input gate functions.

A further advantage of the invention is providing a FPGA that allows PAL-type wired functions.

These and other advantages will be apparent to those skilled in the art having reference to the specification in conjunction with the drawings and claims.

BRIEF DESCRIPTION OF DRAWINGS

In the drawings:

FIG. 3 is a schematic of a configurable output driver according to a second preferred embodiment of the invention;

FIGS. 3a–3c are schematic diagrams of several configurations for the output driver of FIG. 3;

FIG. 4 is a schematic of a configurable output driver according to a third preferred embodiment of the invention;

FIGS. 4a–4b are schematic diagrams of several configurations for the output driver of FIG. 4;

Corresponding numerals and symbols in the different figures refer to corresponding parts unless otherwise indicated.

DETAILED DESCRIPTION OF THE INVENTION

The preferred embodiments of the invention will be described in conjunction with an antifuse-based FPGA. It will be apparent to those skilled in the art that the advantages of the invention are also applicable to other types of FPGAs.

Figure 1:
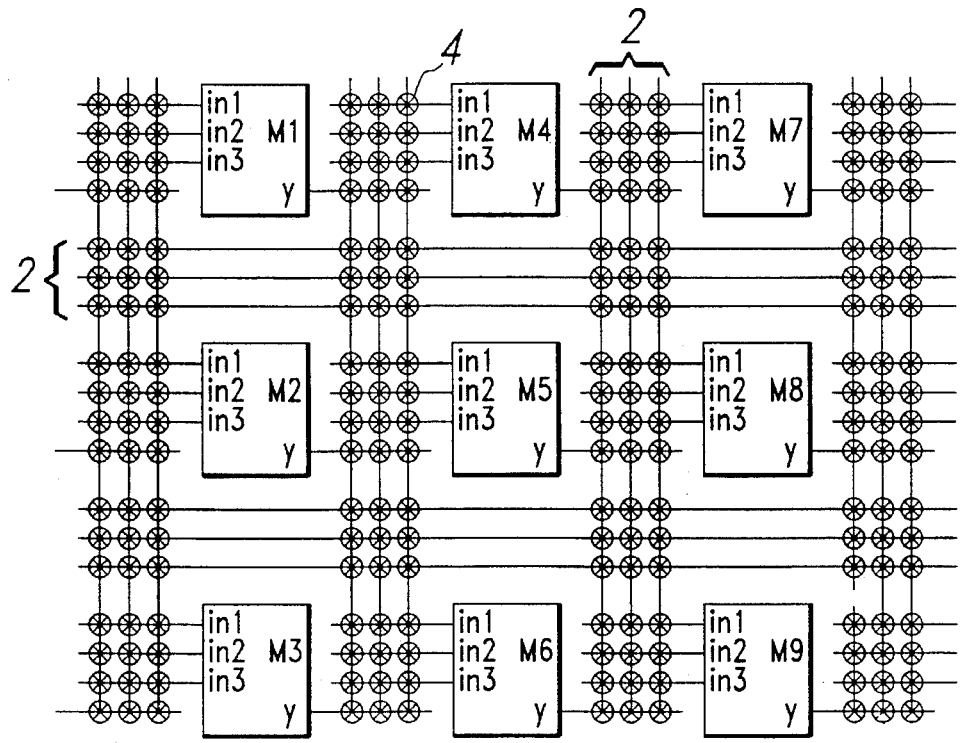
FIG. 1 is a schematic diagram of a partial cutaway of a FPGA according to the invention.

A partial view of a FPGA according to the preferred embodiments of the invention is shown in FIG. 1. Logic modules, M1–M9, are arranged in rows and columns. Logic modules M1–M9 are shown as having three inputs, in1, in2, and in3 and one output, y. However, as will be apparent to those skilled in the art, the number of inputs may vary. Interconnect lines 2 run between the logic modules for connecting the inputs and output of the logic modules together in order to accomplish the desired function. Obviously, the number of interconnect lines 2 will also vary by design. Interconnections are made by blowing the appropriate antifuses 4. It will be aparent to those of ordinary skill in the art that other types of programmable elements, such as fuses, may alternatively be used.

The typical output of a logic module of an antifuse-based FPGA will consist of a driver that powers antifuse connections to other modules. A driver according to the preferred embodiments of the invention is configured with some additional circuitry so that the logic module output may be wired with the output of adjacent module drivers in a manner similar to programmable array logic (PALs). Module drivers may then be interconnected in a row, in a column, or even randomly. For example, the outputs of logic modules M1, M2, and M3 may by wired together by blowing antifuses 5, 6, and 7. There are several ways the output driver may be configured to achieve this wired PAL-TYPE function. In several embodiments described below, a weak P-channel used as a pull-up for each logic module. Each time a module is put on a line, an extra pull-up is added which will increase power and improve speed as long as the added pull-up can overcome the increased load.

Another implementation, also described below, may remove the weak p-channel from the line so that only n-channels are on the line. A pullup/senseamp may then be added at the end (or anywhere else outside of the module) of the row and column so that a true PAL design circuitry may be used with "small swing" detection senseamps. Such senseamps are well known in the art. The outputs of the senseamp may then drive vertically or horizontally or back to the arrays. Also, the n-channel outputs may be tied to a dedicated line to lower the capacitance if deemed necessary. If not, the outputs themselves drive inputs that are tied on an antifuse on the line. This idea may be carried on to more than just the output of the module. Internal drivers within the module may also be wired with other adjacent internal drivers to perform more than one wired function between modules.

Figure 2:
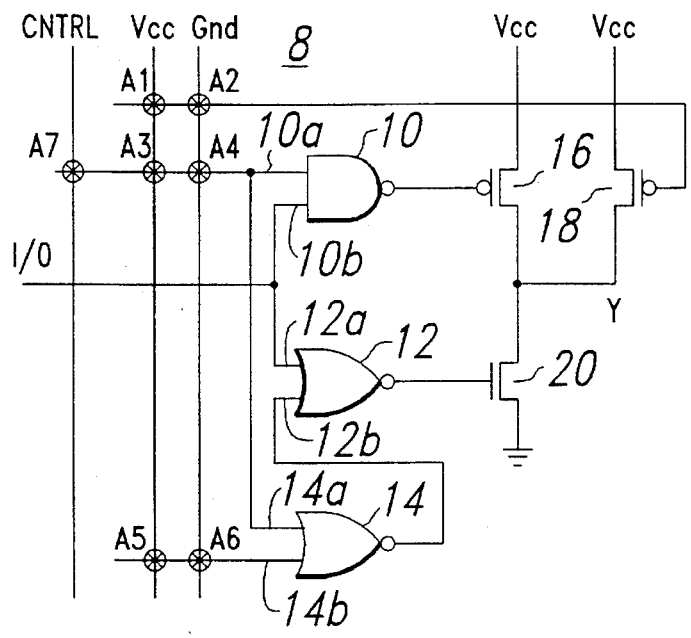
FIG. 2 is a schematic of a configurable output driver according to a first preferred embodiment of the invention.

Referring to FIG. 2, output driver 8 forms part of a logic module of an FPGA. Signal I/O is an internal node of a logic module and node y is the output of the logic module. I/O is connected to input 10b of NAND 10 and input 12a of NOR 12. Input 10a of NAND 10 is connected to antifuses A3, A4, and A7 which are operable to connect input 10a to Vcc, Gnd, or CNTRL, respectively. It will be apparent to those skilled in the art that other programmable elements, such as fuses, may alternatively be used in place of the antifuses. Input 12b of NOR 12 is connected to the output of NOR 14. Input 14a of NOR 14 is connected to antifuses A3, A4, and A7 and input 14b is connected to antifuses A5 and A6. P-channel transistor 16 is connected between Vcc and n-channel 20 and has a gate connected to the output of NAND 10. N-channel 20 is connected between p-channel 16 and ground and has a gate connected to the output of NOR 12. Weak p-channel transistor 18 is connected between Vcc and n-channel 20 and has a gate connected to antifuses A1 and A2.

The output driver 8 of FIG. 2 may be configured several ways as shown in FIGS. 2a–2d.

Figure 2A:
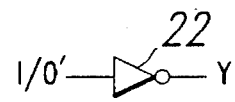
FIGS. 2a–2d are schematic diagrams of several configurations for the output driver of FIG. 2.

The configuration shown in FIG. 2a allows the output driver 8 to act as a typical inverter 30 and is used when no wired configuration is desired. Antifuses A1 and A3 are blown to connect to VCC. Input 10a of NAND 10 and input 12a of NOR 12 are thus at a constant high level (a binary 1). The output of NOR 14 (and therefore, the input 12b of NOR 12) is thus low regardless of the signal on input 14b. Input 14b can thus be connected to either Vcc or Gnd through antifuses A5 or A6. Both the output of NAND 10 and NOR 12 will allow the signal I/O to pass through generating an output (I/O)'. The (I/O)' signal then drives the circuitry of transistors 16 and 20 which are configured as a conventional inverter.

Summarizing, the outputs of both NAND 10 and NOR 12 are equal to the inversion of the input signal I/O, (I/O)'. The signal at node y will be the inversion of (I/O)' which is I/O.

Figure 2B:
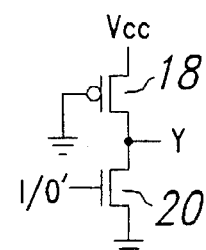

The configuration shown in FIG. 2b allows the output driver 8 to be wired with the outputs of other logic modules. Antifuses A2, A4 and A5 are blown to achieve the configuration shown in FIG. 2b. Weak p-channel transistor 18 is turned on by connecting its input to Gnd through antifuse A2 so that it may be used as a pull-up transistor to node y. Because input 10a of NAND 10 is tied low, the output of NAND 10 will be high and consequently, will turn off p-channel transistor 16. Input 14b of NOR 14 is tied high through antifuse A5 and input 14a is tied low through antifuse A4. Accordingly, the output of NOR 14 will be low and the output of NOR 12 will be the inversion of signal I/O (I/O'). This configuration may be used when the outputs of two or more logic modules are to be tied together. Weak p-channel transistor 18 is designed to have high resistivity such that only a small amount of current will drain from Vcc to Gnd when the outputs of several logic modules are tied together and have differing signal levels (i.e., when at least one output is high and at least one output is low).

Figure 2C:
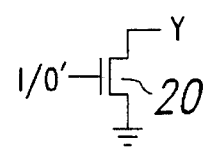
Figure 5:
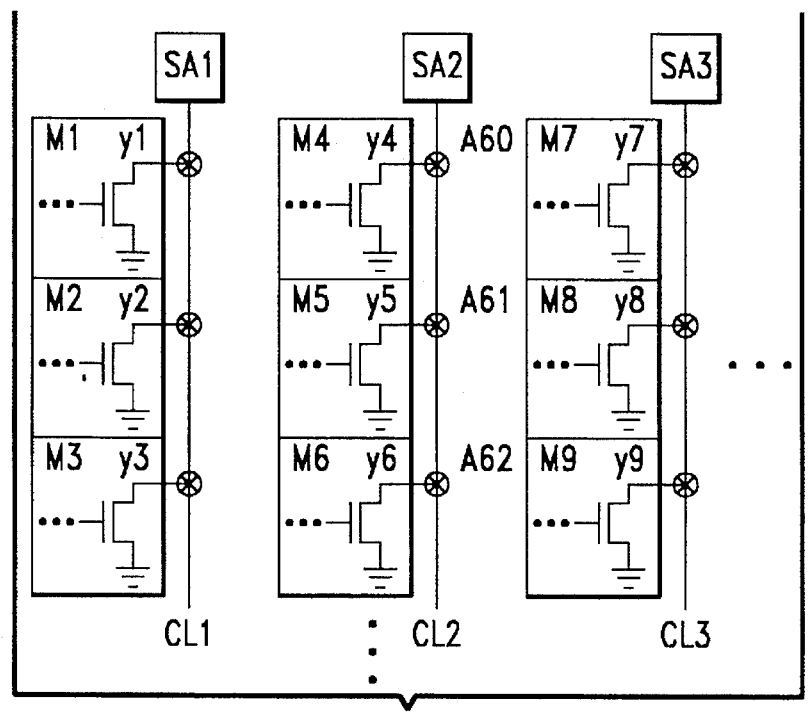
FIG. 5 is a block diagram of an FPGA having senseamps connected to column interconnect lines according to the invention.
Figure 6:
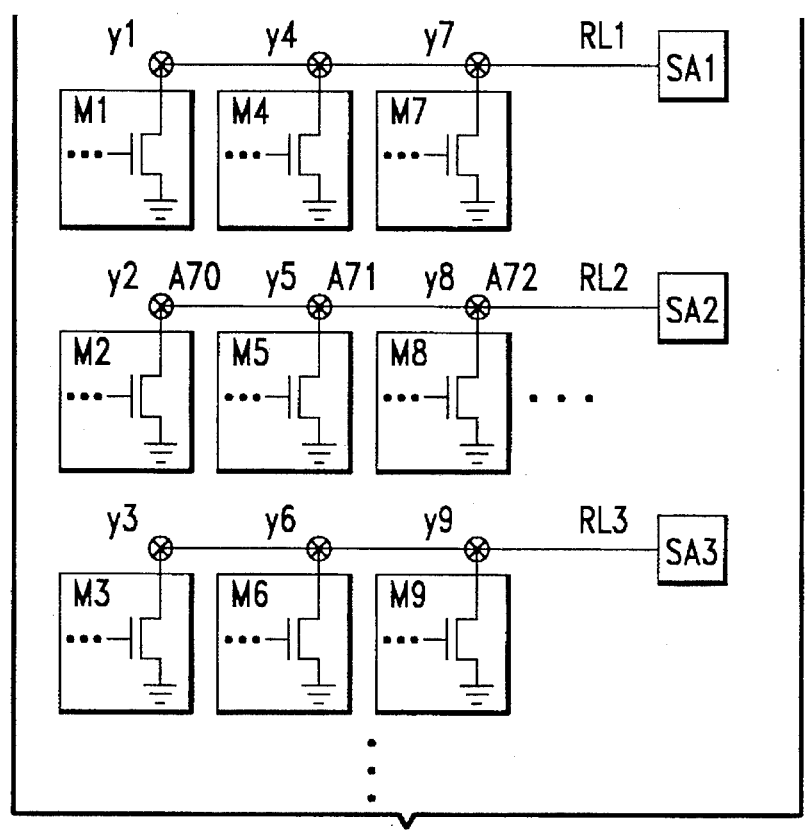
FIG. 6 is a block diagram of an FPGA having senseamps connected to row interconnect lines according to the invention.

A third configuration of the circuit of FIG. 2 is shown in FIG. 2c. This configuration may also be used when it is desirable to wire outputs of several logic modules together. However, because the weak p-channel transistor 18 is turned off in this configuration, a senseamp is connected to the wired outputs at the end of a row or column as shown in FIGS. 5 and 6.

In the configuration of FIG. 2c, antifuses A1, A4, and A5 are blown. Input 10a of NAND 10 is connected to Gnd. Accordingly, the output of NAND 10 is high and transistor 16 is turned off. Input 14a is connected to GND and 14b is connected to Vcc through antifuse A5. Thus, the output of NOR 14 is low, causing the output of NOR 12 to be the inverse of I/O (I/O'). The gate of weak p-channel transistor 18 is connected to Vcc through antifuse A1. Accordingly, p-channel transistor 18 is turned off and the configuration of FIG. 2c is obtained.

Figure 2D:
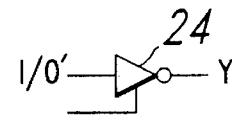

A fourth configuration is shown in FIG. 2d. Antifuses A1, A6 and A7 are blown. P-channel transistor 18 is turned off through the connected of its gate to Vcc through antifuse A1. Input 14b of NOR 14 is connected to Gnd through antifuse A6 and input 14a is connected to control signal CNTRL. Thus, the output of NOR 14 (and accordingly, the input 12b of NOR 12) will be the inverse of CNTRL, CNTRL'. Input 10b and 12a are connected to signal I/O. In this configuration, the output of another logic module (not shown) may serve as CNTRL, thus effectively "anding" the output CNTRL with I/O.

A second preferred embodiment of an output driver is shown in FIG. 3. The input of inverter 32, the gate of p-channel transistor 44, and the gate of n-channel transistor 36 may be connected to Vcc or Gnd through antifuses A10 and A11, respectively. The output of inverter 32 is connected to the gate of p-channel transistor 34. Signal I/O is connected to the gate of n-channel transistor 38. Transistors 34 and 36 are connected between I/O and the gate of transistor 40. Transistor 44 is connected between Vcc and the gate of transistor 40. P-channel transistor 40 and n-channel transistor 38 are the driver transistors and are connected between Vcc and Gnd. P-channel transistor 42 is a weak, highly resistive transistor that may function as a pull-up transistor. The gate of p-channel transistor may be connected to the gate of transistor 40 or the gate of transistor 44 through antifuses A13 and A12, respectively. Node y is the output node of the logic module. The output driver shown in FIG. 3 may be configured several different ways as shown in FIGS. 3a–3c and described hereinbelow.

A first configuration of the second preferred embodiment is shown in FIG. 3a and is used when no wired function is desired. Antifuses A10 and A12 are blown. Because antifuse A10 is blown, Vcc is connected to the gate of transistor 36 turning it on. Vcc is also applied to inverter 32 which, in turn, applies a logic low to the gate of p-channel transistor 34. Thus, transistor 34 is also turned on. With both transistors 34 and 36 on, I/O is applied to both p-channel transistor 40 and n-channel 38 as in a standard output driver. With antifuse A12 blown, Vcc is also applied to both p-channel transistors 44 and 42. Accordingly, both are turned off and the configuration shown in FIG. 3a is obtained.

FIG. 3b shows a second configuration for the circuit of FIG. 3. In this configuration, antifuses A11 and A12 are blown and the output, y, may be wired to the outputs of other logic modules. Transistor 36 is turned off because its gate is connected to Gnd through antifuse A11. Transistor 34 is also off because its gate is connected to the output of inverter 32 which is high due to the fact that the input of inverter 32 is connected to Gnd. Accordingly, I/O is not connected to the gate of transistor 40. Transistor 44 is turned on because its gate is connected to Gnd through antifuse A11 and pull-up transistor 42 is also turned on because its gate is connected to ground through antifuses A11 and A12. Vcc is thus applied to the gate of p-channel transistor 40 turning it off. Consequently, the configuration shown in FIG. 3b is obtained.

FIG. 3c shows a third configuration for the circuit of FIG. 3. In this configuration, antifuses A11 and A13 are blown and the output, y, may be wired to the outputs of other logic modules. Transistor 36 is turned off because its gate is connected to Gnd through antifuse A11. Transistor 34 is also off because its gate is connected to the output of inverter 32 which is high due to the fact that the input of inverter 32 is connected to Gnd. Accordingly, I/O is not connected to the gate of transistor 40. Transistor 44 is turned on because its gate is connected to Gnd through antifuse A11. Vcc is thus applied to the gate of p-channel transistor 40 turning it off. Because antifuse A13 is blown in this configuration, Vcc is also applied to the gate of pull-up transistor 42 turning it off. Consequently, the configuration shown in FIG. 3c is obtained. A senseamp may be connected to the wired outputs as shown in FIGS. 5 and 6.

A third preferred embodiment of an output driver for an FPGA logic module is shown in FIG. 4. P-channel transistor 52 and n-channel transistor 54 are connected as in the typical output driver. However, instead of being connected directly to Vcc, a second p-channel transistor 50 is placed between Vcc and p-channel transistor 52. The gate of p-channel transistor 50 is connected to either Vcc or Gnd through antifuses A20 and A21, respectively. Inverter 58 is connected between antifuses A20 and A21 and the gate of pull-up transistor 56. Pull-up transistor 56 is connected between Vcc and node y. Accordingly, if no wired function is desired, antifuse A21 is blown. This applies Gnd to the gate of transistor 50 turning it on. Because of inverter 58, a high voltage is applied to pull-up transistor 56 turning it off. A high voltage is supplied to transistor 52 through transistor 50 and the configuration shown in FIG. 4a is obtained. Alternatively, if antifuse A20 is blown, transistor 50 is turned off and power is not supplied to transistor 52. A low voltage is applied to pull-up transistor 56 resulting in the configuration shown in FIG. 4b.

Many variations to the above described embodiments will be apparent to those skilled in the art. For example, if a senseamp is to be used, the pull-up transistor (18, 42, or 56) and its corresponding circuitry may be omitted. Alternatively, a CNTRL option as described in conjunction with the first embodiment may be applied to the second and third embodiments. The CNTRL option may also be omitted from the first embodiment.

FIGS. 5 and 6 each show a portion of an FPGA according to the preferred embodiments having senseamps connected to interconnect lines. In FIG. 5, senseamps SA1, SA2, and SA3 are connected to column interconnect lines CL1, CL2, and CL3 in which the output of logic modules may be wired together. Only three column interconnect lines and no row interconnect lines are shown for simplicity. As an example, logic modules M4, M5, and M6 may be wired together by blowing antifuses A60, A61, and A62. In FIG. 6, senseamps SA1, SA2, and SA3 are connected to row interconnect lines RL1, RL2, and RL3 in which the output of logic modules may be wired together. Only three row interconnect lines and no column interconnect lines are shown for simplicity. As an example, logic modules M2, M5, and M8 may be wired together by blowing antifuses A70, A71, and A72.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A field programmable logic array having a plurality of logic modules, comprising:

a configurable output driver in each of said plurality of logic modules that enables a plurality of output nodes of said plurality of logic modules to be connected together for a wired logic function and that enables each of said plurality of output nodes to be connected separately to one of a plurality of output lines, wherein said configurable output driver comprises:

a p-channel driver transistor connected to one of said output nodes:

a n-channel driver transistor connected between said one of said output nodes and ground; and driver disable circuitry operable to disable said p-channel driver transistor when said plurality of output nodes are to be connected together, said driver disable circuitry comprising:

a first programmable element connected between said driver disable circuitry and logic signal in order to provide a high logic signal to a gate of said p-channel driver transistor; and a second programmable element connected between said driver disable circuitry and a second logic signal in order to supply an internal logic signal to said gate of said p-channel driver transistor.

2. The FPGA of claim 1, wherein said driver disable circuitry comprises a p-channel transistor operable to interrupt a supply voltage from reaching said p-channel driver transistor.

3. The FPGA of claim 1, wherein said driver disable circuitry comprises signal interrupt circuitry operable to interrupt an internal logic module signal from reaching a gate of said p-channel driver transistor or operable to supply said internal logic module signal to said gate of said p-channel driver transistor.

4. The FPGA of claim 1, wherein said driver disable circuitry further comprises a third programmable element connected between said driver disable circuitry and a control signal that determines whether to provide said high logic signal or said internal logic signal to said gate of said p-channel driver transistor.

5. The FPGA of claim 4, wherein said first, second, and third programmable elements comprise antifuses.

6. The FPGA of claim 1, wherein said plurality of logic modules further comprise:

a. a p-channel pull-up transistor connected between a supply voltage and said one of said output nodes; and b. pull-up circuitry operable to selectively connect a gate of said p-channel pull-up transistor to a logic low signal or a logic high signal.

7. The FPGA of claim 1, further comprising:
   a. at least one interconnect line for connecting said output nodes when said plurality of output nodes are to be connected together; and
   b. a senseamp connected to said at least one interconnect line.

8. The FPGA of claim 7, wherein said output nodes are arranged in a row.

9. The FPGA of claim 7, wherein said output nodes are arranged in a column.

10. The FPGA of claim 7, wherein said output nodes are arranged in a randomly.

11. A method of configuring the output drivers of at least two logic modules of a FPGA comprising the steps of:
    a. providing a first programmable element operable to disable current conduction in a p-channel driver transistor if a first and second output of said at least two logic modules are to be connected together;
    b. providing a second programmable element operable to provide an internal logic signal to a gate of said p-channel driver transistor if said first and second outputs are to be separately connected to first and second output lines, respectively;
    c. selectively blowing one of said first and second programmable elements; and
    d. providing said internal logic signal to an n-channel driver transistor connected between said n-channel driver transistor and ground.

12. The method of claim 11, further comprising the step of
    connecting said first and second outputs of said at least two logic modules to a first interconnect line when said first and second outputs are to be connected together.

13. The method of claim 12, further comprising the step of providing a senseamp connected to said first interconnect line.

14. The method of claim 11, further comprising the step of providing a pull-up transistor for said first and second outputs when said first and second outputs are to be connected together.

* * * * *